United States Patent [19]

Komatsuda et al.

[11] Patent Number: 5,790,239
[45] Date of Patent: Aug. 4, 1998

[54] ILLUMINATION OPTICAL APPARATUS CONTAINING AN OPTICAL INTEGRATOR AND PROJECTION EXPOSURE APPARATUS USING THE SAME

[75] Inventors: Hideki Komatsuda, Kawasaki; Osamu Tanitsu, Funabashi, both of Japan

[73] Assignee: Nikon Corporation, Tokyo, Japan

[21] Appl. No.: 654,918

[22] Filed: May 29, 1996

[30] Foreign Application Priority Data

May 29, 1995 [JP] Japan ............................ 7-130438
May 22, 1996 [JP] Japan ............................ 8-127421

[51] Int. Cl.$^6$ .................... G03B 27/42; G03B 27/54; G03B 27/72
[52] U.S. Cl. ........................ 355/67; 355/53; 355/71
[58] Field of Search ..................... 359/618, 619, 359/629, 741, 455; 355/53, 67, 71

[56] References Cited

U.S. PATENT DOCUMENTS

| | | |
|---|---|---|
| 4,497,015 | 1/1985 | Konno et al. . |
| 4,918,583 | 4/1990 | Kudo et al. . |
| 4,939,630 | 7/1990 | Kikuchi et al. . |
| 5,237,367 | 8/1993 | Kudo . |
| 5,245,384 | 9/1993 | Mori . |
| 5,307,207 | 4/1994 | Ichihara ........................ 359/619 |
| 5,594,526 | 1/1997 | Mori et al. ..................... 355/619 |
| 5,594,587 | 1/1997 | Komatsuda et al. ........... 355/71 |
| 5,631,773 | 5/1997 | Suzuki ........................... 355/53 |
| 5,636,003 | 6/1997 | Tanitsu et al. ................. 355/67 |
| 5,644,390 | 7/1997 | Yasuzato ........................ 355/67 |

FOREIGN PATENT DOCUMENTS

| | | |
|---|---|---|
| 6-196513 | 7/1992 | Japan . |
| 6-196389 | 7/1994 | Japan . |
| 6-267894 | 9/1994 | Japan . |

*Primary Examiner*—R. L. Moses
*Assistant Examiner*—Shival Virmani
*Attorney, Agent, or Firm*—Foley & Lardner

[57] ABSTRACT

An illumination optical apparatus has an optical integrator and a condenser optical system. The optical integrator has first and second stages in which a plurality of lens elements each having a rectangular lens surface with long and short sides are arranged while the short sides are set adjacent to each other. The first and second stages are arranged adjacent to each other. A position where the short sides are adjacent to each other in the first stage is different from that in the second stage along a longitudinal direction. Therefore, in the illumination optical apparatus, a resolution difference between a pattern along the vertical direction and that in the horizontal direction caused by a rectangular illuminated area with long and short sides or an arcuated illuminated area can be prevented, so that resolution with a uniform line width can be achieved.

27 Claims, 13 Drawing Sheets

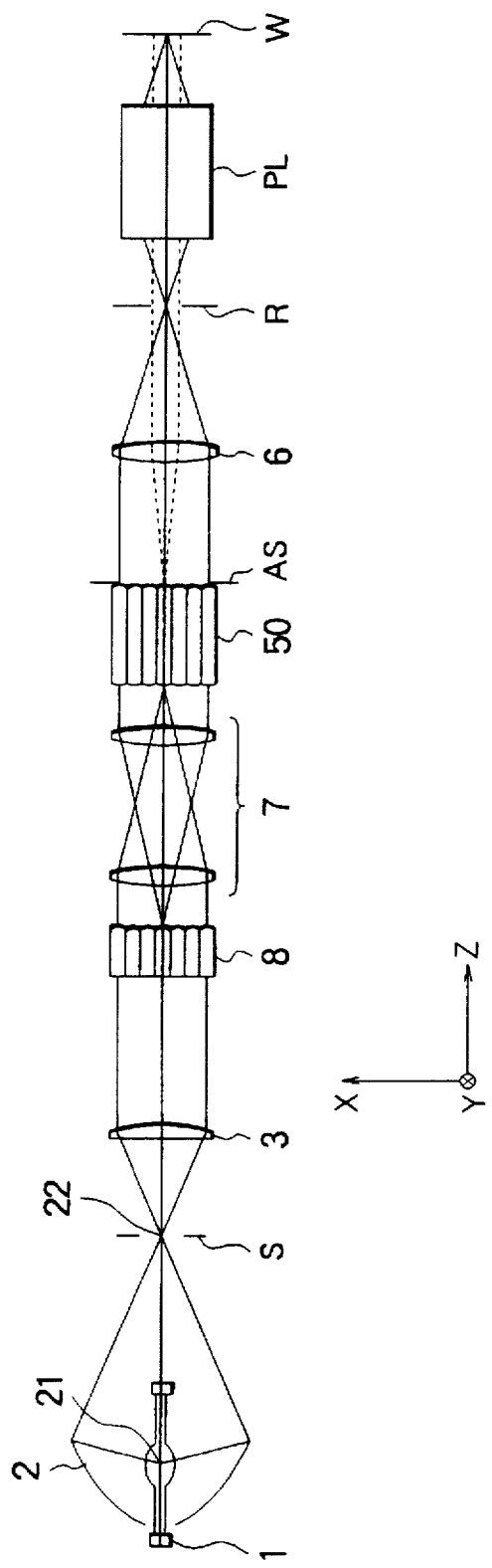

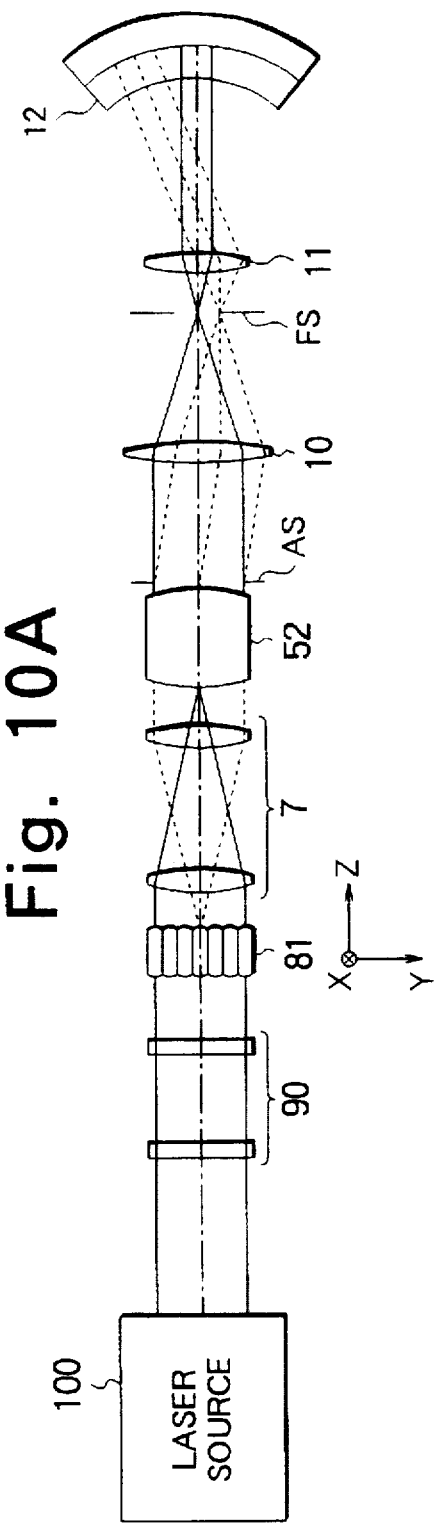
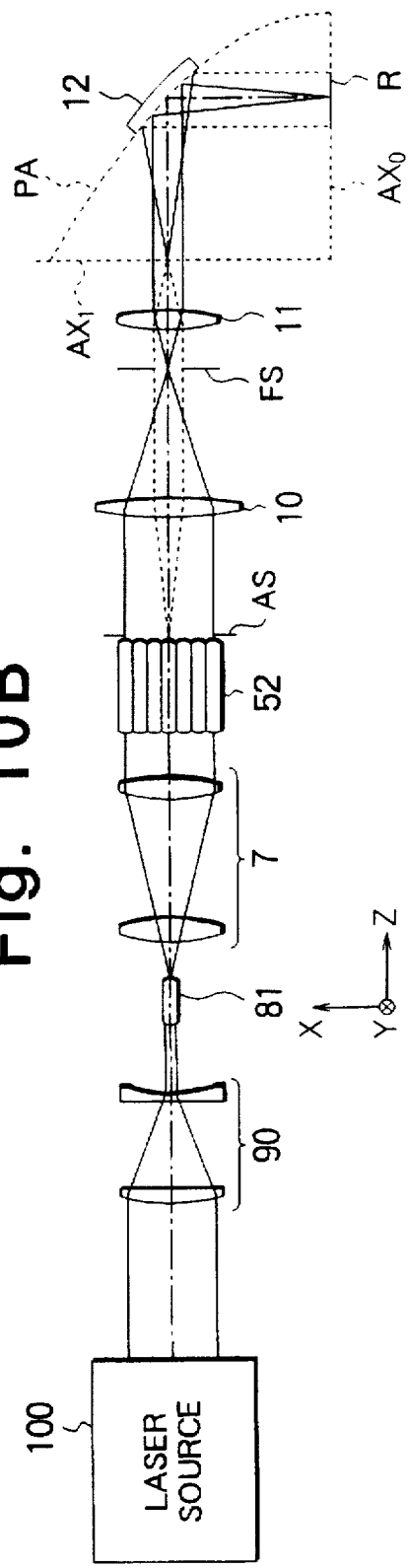

ILLUMINATION OPTICAL APPARATUS CONTAINING AN OPTICAL INTEGRATOR AND PROJECTION EXPOSURE APPARATUS USING THE SAME

BACKGROUND OF THE INVENTION

1. Field of the Invention

The present invention relates to an illumination optical apparatus for uniformly illuminating a target illumination object and a projection exposure apparatus having the same and, more particularly, to an illumination optical apparatus suitable for a projection exposure apparatus used in lithography in processes of manufacturing a semiconductor element, a liquid crystal display element, or the like.

2. Related Background Art

As a conventional projection exposure apparatus, a step and repeat type exposure apparatus, i.e., a so-called stepper is known in which the entire pattern of an original plate (reticle) on which a circuit to be projected and exposed is drawn is sequentially projected and exposed on a photosensitive substrate such as a wafer or plate coated with a photosensitive material in every shot through a projection optical system (projection lens). This apparatus is excellent in resolving power and throughput.

In recent years, a scan type projection exposure apparatus has been proposed to achieve a higher throughput at a higher resolving power.

A scan type projection exposure apparatus is proposed in, e.g., Proc. SPIE, 1088 (1989), pp. 424–433, in which a reflection reduction optical system having an arcuated image field is used to project and expose the pattern of a reticle on a wafer.

In another scan type projection exposure apparatus, a normal projection optical system (full field type projection optical system) having a circular image field is used to project and expose the pattern of a reticle on a wafer by the step and scan method. For example, Japanese Patent Laid-Open No. 4-196513 proposes a method of scanning a rectangular image field. The apparatus of this proposal can ensure a higher resolving power while realizing a higher throughput by using a wide exposure field and hence has received a great deal of attention as an exposure apparatus of the next generation replacing the above-described step and repeat type exposure apparatus.

FIG. 12 shows a conventional illumination optical apparatus for a typical step and scan type exposure apparatus. An X-Y-Z coordinate system is employed in FIG. 12.

Referring to FIG. 12, a mercury lamp 1 serving as a light source is arranged at a first focal point 21 of an elliptical mirror 2 serving as a condenser mirror. A light beam from this mercury lamp 1 is condensed at a second focal point 22 of the elliptical mirror. A shutter S for controlling the exposure light beam is arranged at the second focal point 22. The divergent beam from the second focal point 22 is collimated into a parallel beam by a collimator lens 3. Thereafter, a light beam having a predetermined exposure wavelength (e.g., g-line having a wavelength of 436 nm or i-line having a wavelength of 365 nm) is selected through a bandpass filter 4. The light beam having the predetermined exposure wavelength is incident on a fly-eye lens 5 consisting of a plurality of lens elements.

FIG. 13 is an X-Y plan view showing the fly-eye lens 5 shown in FIG. 12, which is viewed from the illuminated surface side (from the -Z direction side). As shown in FIG. 13, the fly-eye lens 5 consists of a plurality of lens elements 5a each having a rectangular lens section with long and short sides, and these lens elements are arranged in a matrix. Each lens element 5a condenses the light beam incident on the fly-eye lens 5 to form a light source image 5b on the illuminated surface side. For the entire fly-eye lens 5, the plurality of light source images formed by the lens elements 5a can be regarded as a pseudo surface illuminant. This surface illuminant will be referred to as a secondary source hereinafter.

Referring back to FIG. 12, an aperture stop AS for determining the σ value of the illumination system is arranged on the exit surface of the fly-eye lens 5. A plurality of light beams from the plurality of light source images (secondary sources) formed on the exit side of the fly-eye lens 5 are condensed by a condenser lens 6 and superposed on a reticle R as a target illumination object. Therefore, the reticle R is illuminated at a uniform illuminance. The illuminated pattern of the reticle R is projected and exposed on a wafer W through a projection optical system PL.

As shown in FIG. 13, in the conventional fly-eye lens 5, the lens elements are arranged while their long and short sides match each other such that the size of the entire fly-eye lens 5 is minimized to easily manufacture the fly-eye lens 5.

In the step and scan type exposure apparatus, the reticle is generally illuminated with a slit-like or arcuated illumination field, thereby maximizing the ratio of the illumination field of the illumination system to an area illuminated in scanning. Therefore, each of the plurality of lens elements constituting the fly-eye lens used in the step and scan type exposure apparatus has a rectangular section with long and short sides having largely different lengths. The reason for this is as follows. The incident surface of the fly-eye lens is conjugate to the mask and wafer. For this reason, each lens element on the incident surface of the fly-eye lens serves as a certain field stop. To efficiently illuminate the elongated illumination field, the shape of this elongated illumination field must be similar to the sectional shape of each lens element of the fly-eye lens.

When each of the lens elements constituting the fly-eye lens has a rectangular section with long and short sides having largely different lengths, the pitch of the plurality of light source images 5b in the X direction largely differs from that in the Y direction, as shown in FIG. 13. For this reason, when the projection/exposure operation is performed on the basis of the light beams from the plurality of light source images 5b, the resolving power in the vertical direction (X direction in FIG. 12) differs from that in the horizontal direction (Y direction in FIG. 12). Therefore, the line width of a pattern formed on the wafer undesirably changes.

SUMMARY OF THE INVENTION

It is an object of the present invention to provide an illumination optical apparatus capable of realizing a uniform surface illuminant while efficiently forming a rectangular illumination field. It is another object of the present invention to provide a projection exposure apparatus capable of achieving resolution with a uniform line width.

In order to achieve the above objects, according to the present invention, there is provided an illumination optical apparatus comprising:

a light source;

an optical integrator for forming a plurality of light source images on the basis of a light beam from the light source; and a condenser optical system for condensing light beams emerging from the optical integrator to illuminate a predetermined surface in a superposed manner, wherein the optical integrator has first and second stages in which a plurality of lens elements each having a rectangular lens section with long and short sides are arranged while the short sides are set adjacent to each other, the first and second stages are arranged adjacent to each other, and a position where the short sides are adjacent to each other in the first stage is different from that in the second stage along a longitudinal direction.

There is also provided a projection exposure apparatus comprising:

an illumination optical system for illuminating a first object; and a projection optical system for forming an image of the first object on a second object, wherein the projection optical system has a light source, an optical integrator for forming a plurality of light source images on the basis of a light beam from the light source, and a condenser optical system for condensing light beams emerging from the optical integrator to illuminate a predetermined surface in a superposed manner, the optical integrator has first and second stages in which a plurality of lens elements each having a rectangular lens surface with long and short sides are arranged while the short sides are set adjacent to each other, the first and second stages are arranged adjacent to each other, and a position where the short sides are adjacent to each other in the first stage is different from that in the second stage along a longitudinal direction.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4 is a view schematically showing the entire arrangement of an illumination optical apparatus according to the second embodiment of the present invention, which is applied to a projection exposure apparatus;

FIG. 10A is a Y-Z plan view showing the entire arrangement of an illumination optical apparatus according to the fifth embodiment of the present invention, which is applied to a projection exposure apparatus;

FIG. 10B is an X-Z plan view showing the entire arrangement of the illumination optical apparatus according to the fifth embodiment of the present invention, which is applied to a projection exposure apparatus;

DESCRIPTION OF THE PREFERRED EMBODIMENTS

The embodiments of the present invention will be described below with reference to the accompanying drawings.

First Embodiment

Figure 1:
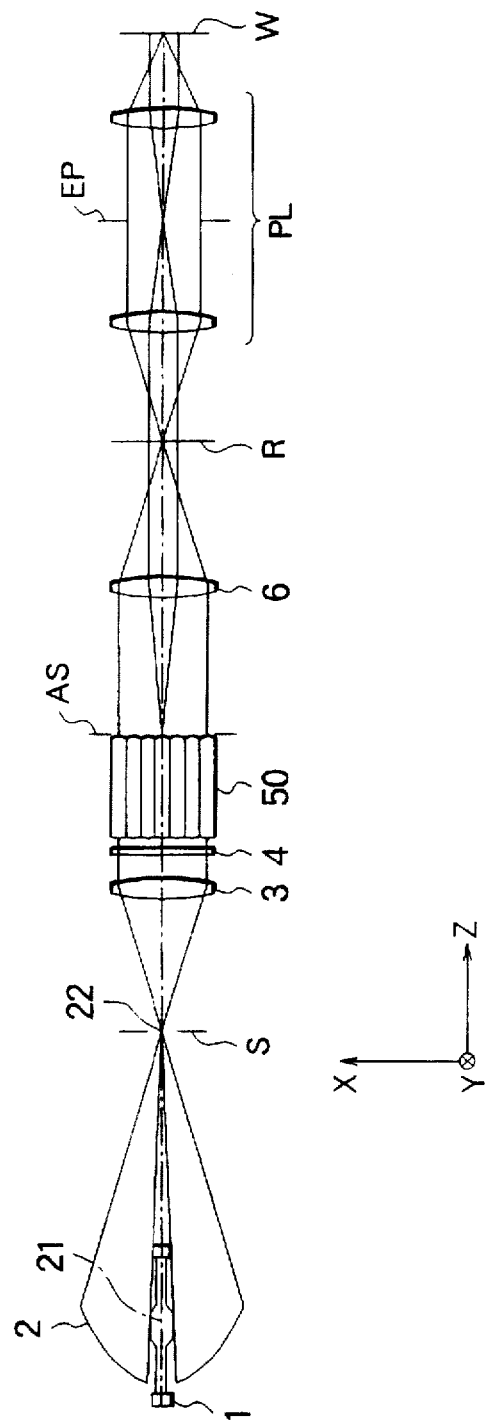
FIG. 1 is a view schematically showing the overall arrangement of an illumination optical apparatus according to the first embodiment of the present invention, which is applied to a projection exposure apparatus.
Figure 12:
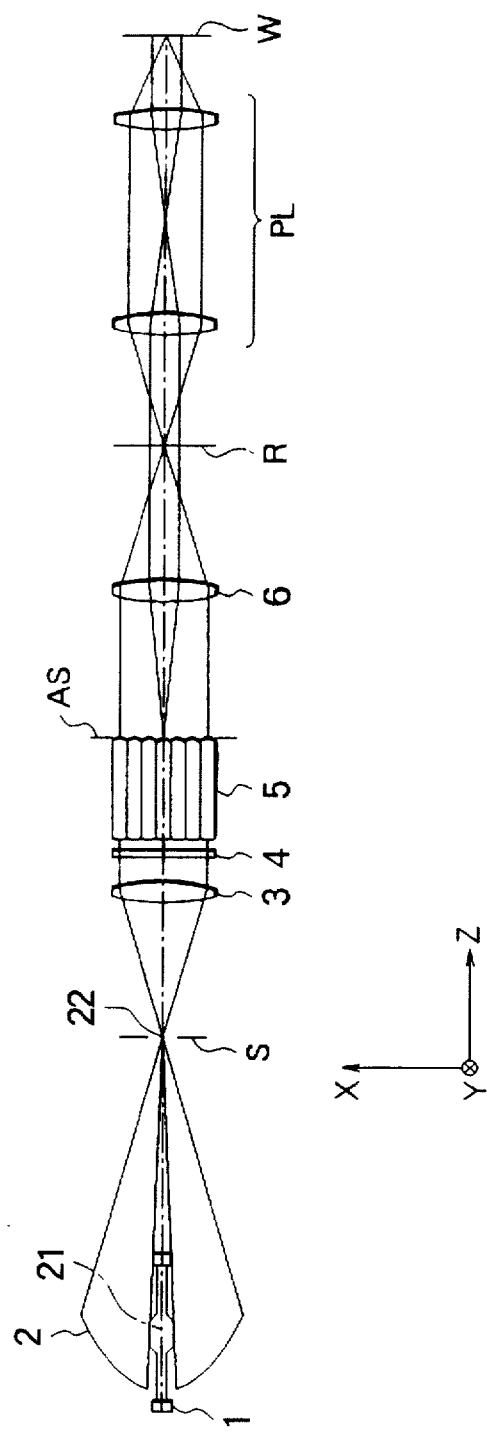
FIG. 12 is a view schematically showing a conventional illumination optical apparatus for an exposure apparatus.
Figure 13:
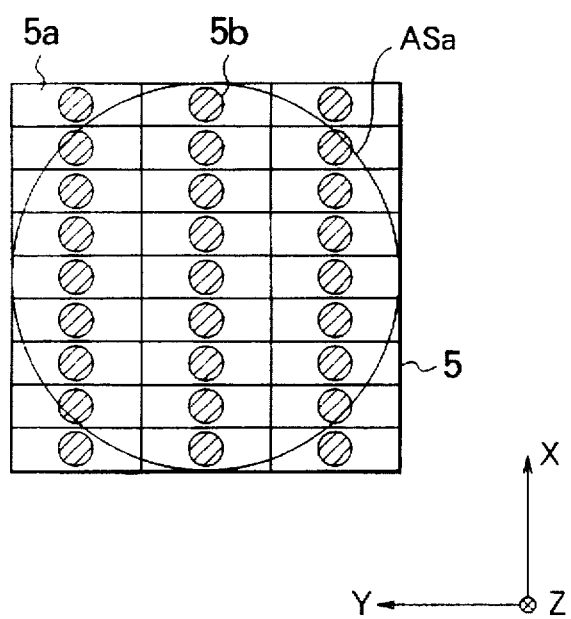
FIG. 13 is an X-Y plan view showing a fly-eye lens shown in FIG. 12, which is viewed from an illuminated surface side.

FIG. 1 schematically shows the entire arrangement of an illumination optical apparatus of the present invention, which is applied to a step and scan type projection exposure apparatus. An X-Y-Z coordinate system is employed in FIG. 1. The same reference numerals as in FIG. 12 denote the same members in FIG. 1.

As shown in FIG. 1, a mercury lamp 1 serving as a light source is arranged at a first focal point 21 of an elliptical mirror 2 serving as a condenser mirror. A light beam from the mercury lamp 1 is condensed at a second focal point 22. The divergent beam from the second focal point 22 is collimated into a parallel beam by a collimator lens 3 serving as a collimator optical system which is arranged to have a front focal position matching the second focal point 22. A light beam having a predetermined exposure wavelength (e.g., g-line having a wavelength of 436 nm or i-line having a wavelength of 365 nm) is selected through a bandpass filter 4. The light beam having the predetermined exposure wavelength is incident on a fly-eye lens 50. The fly-eye lens 50 consists of a plurality of lens elements each having a rectangular lens section with long and short sides and lens surfaces at both the ends. An aperture stop AS having a circular opening portion is arranged on the exit side (+Z direction side) of the fly-eye lens 50.

Figure 2:
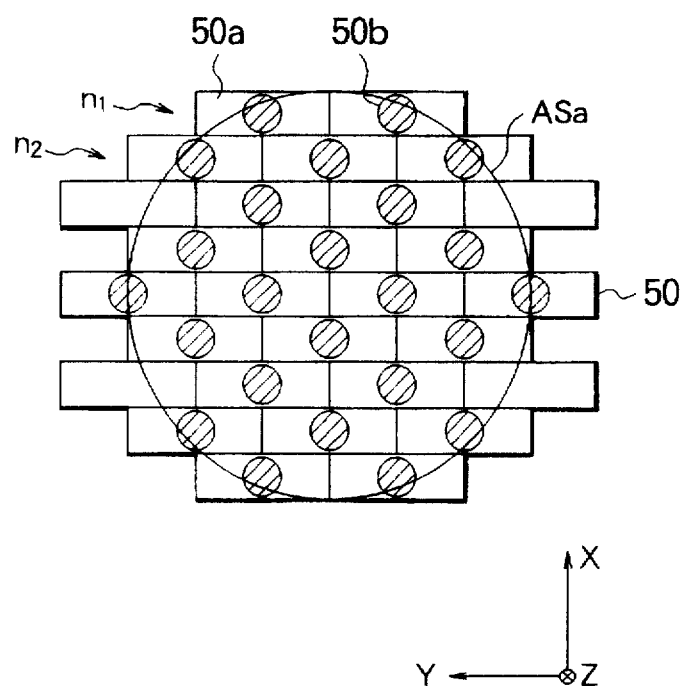
FIG. 2 is a plan view showing a fly-eye lens used in FIG. 1, which is viewed from an illuminated surface side.

FIG. 2 is a plan view showing the fly-eye lens 50 viewed from an illuminated surface side. The coordinate system in FIG. 2 corresponds to that in FIG. 1. Referring to FIG. 2, the fly-eye lens 50 has at least a first stage $50n_1$ in which a plurality of lens elements $50a$ each having a rectangular lens section with short and long sides are arranged while their short sides are set adjacent to each other, and a second stage $50n_2$ in which the plurality of lens elements $50a$ are arranged while their short sides are set adjacent to each other. A plurality of first and second stages may be stacked. The short sides in the first stage $50n_1$ are arranged at positions different from those in the second stage $50n_2$ along the longitudinal direction (Y direction) of the lens elements $50a$.

The fly-eye lens 50 of this embodiment has nine stages in which the plurality of lens elements $50a$ are arranged while their short sides are set adjacent to each other. However, the number of stages is not limited to nine.

FIG. 2 also shows an opening portion ASa of the aperture stop AS arranged at a position (along the Z direction) where a plurality of light source images $50b$ are formed by the fly-eye lens 50.

Referring back to FIG. 1, the divergent light beams from the plurality of light source images formed on the exit side of the fly-eye lens 50 are condensed by the condensing function of a condenser lens 6 serving as a condenser optical system. With this arrangement, the light beams from the fly-eye lens 50 are superposed on a reticle R on which a predetermined circuit pattern is formed to illuminate the reticle R at a uniform illuminance.

In this embodiment, each of the plurality of lens elements $50a$ constituting the fly-eye lens 50 has a rectangular lens section on the incident side. For this reason, a rectangular (slit-like) illumination field is formed on the reticle R. The illuminated portion of the pattern on the reticle R is projected and exposed, through a double-telecentric projection optical system PL (projection lens), on a wafer W coated with a resist.

The reticle R and the wafer W are mounted on a reticle stage and a wafer stage (neither are shown in FIG. 1), respectively, which are movable in the ±X direction. When the wafer W and the reticle R move in the widthwise direction (±X direction in FIG. 1) of the rectangular (slit-like) illumination field in synchronism with each other, a scan exposure operation is realized, so that exposure of a large exposure area can be performed.

In this embodiment, the incident surface of the fly-eye lens 50 is conjugate to the reticle R as a target illumination surface. The exit surface of the fly-eye lens 50 is conjugate to a pupil EP of the projection optical system PL. A secondary source image is formed on the plane of the pupil EP by the fly-eye lens 50. Therefore, the illumination optical apparatus of this embodiment performs Köhler illumination.

Figure 3A:
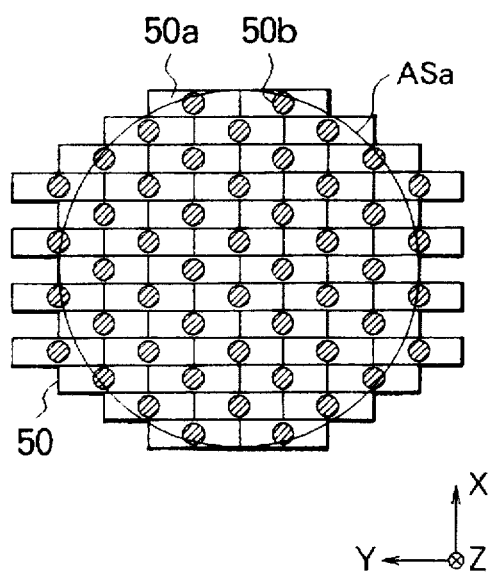
FIG. 3A is an X-Y plan view showing an optical integrator according to the first embodiment of the present invention, which is viewed from the illuminated surface side.
Figure 3B:
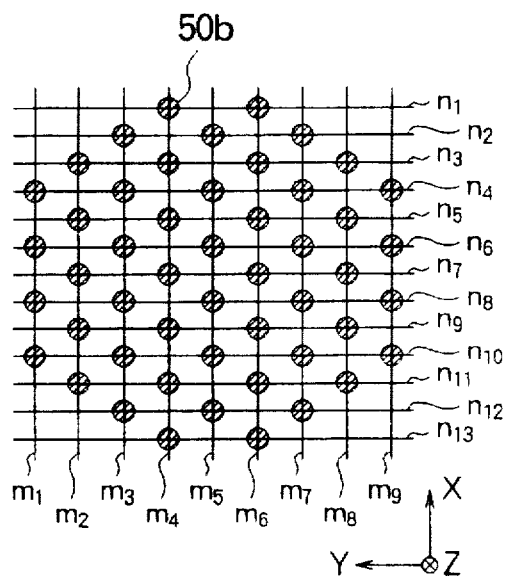
FIG. 3B is an X-Y plan view showing the arrangement of a plurality of light source images formed by the optical integrator shown in FIG. 3A.
Figure 3C:
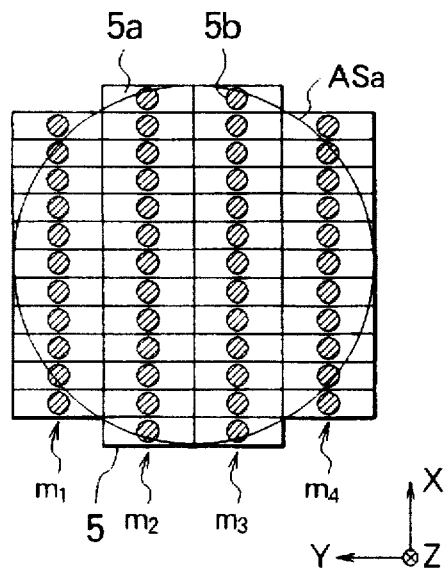
FIG. 3C is an X-Y plan view showing a conventional optical integrator viewed from the illuminated surface side.
Figure 3D:
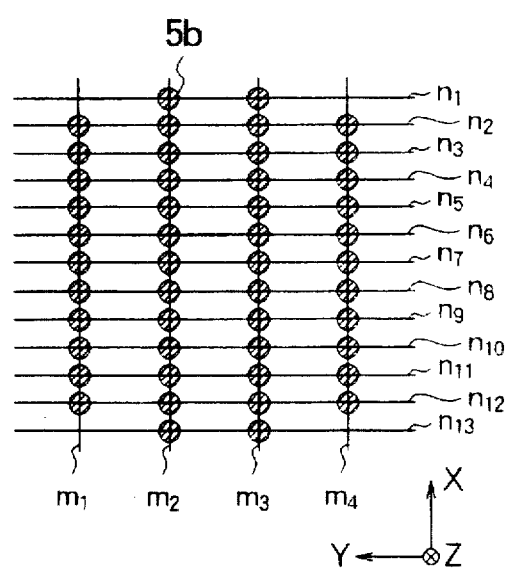
FIG. 3D is an X-Y plan view showing the arrangement of a plurality of light source images formed by the optical integrator shown in FIG. 3C.

FIG. 3A is an X-Y plan view showing the optical integrator of the present invention, which is viewed from the illuminated surface side. FIG. 3B is an X-Y plan view showing the arrangement of a plurality of light source images formed by the optical integrator of the present invention. FIG. 3C is an X-Y plan view showing a conventional optical integrator viewed from the illuminated surface side. FIG. 3D is an X-Y plan view showing the arrangement of a plurality of light source images formed by the conventional optical integrator.

As shown in FIGS. 3A and 3B, the optical integrator of the present invention has the first and second stages (e.g., a row $n_3$ and a row $n_4$) in which the plurality of lens elements $50a$ each having a rectangular lens section with long and short sides are arranged such that their short sides are set adjacent to each other. The short sides in the first stage (row $n_3$) are arranged at positions different from those in the second stage (row $n_4$) along the longitudinal direction (Y direction). Since the difference between the pitch of the rows and that of columns formed by the plurality of light source images $50b$ can be minimized, a uniform surface illuminant can be obtained. With this arrangement, the vertical and horizontal patterns on the reticle can be projected and exposed at almost the same resolving power, so that the line width on the wafer can be made uniform.

To the contrary, in the prior art shown in FIGS. 3C and 3D, the pitch of a plurality of light source images $5b$ formed by the optical integrator largely changes in rows ($n_1$ to $n_{13}$) and columns ($m_1$ to $m_4$). No uniform surface illuminant can be achieved, and resolution of the vertical pattern on the reticle largely differs from that of the horizontal pattern. Therefore, the line width on the wafer cannot be made uniform.

Second Embodiment

FIG. 4 shows the second embodiment in which the present invention is applied to a step and scan type projection exposure apparatus having an illumination optical system with two fly-eye lenses. FIG. 4 is a view schematically showing the projection exposure apparatus according to the second embodiment, and an X-Y-Z coordinate system is employed in FIG. 4. The same reference numerals as in FIG. 1 denote the same members in FIG. 4.

Referring to FIG. 4, a light beam from a mercury lamp 1 arranged at a first focal point 21 of an elliptical mirror 2 is condensed at a second focal point 22 by the elliptical mirror 2 to form a light source image. The light beam from the second focal point 22 is collimated into a parallel beam by a collimator lens 3, passes through a bandpass filter (not shown), and is incident on a first fly-eye lens 8.

Figure 5B:
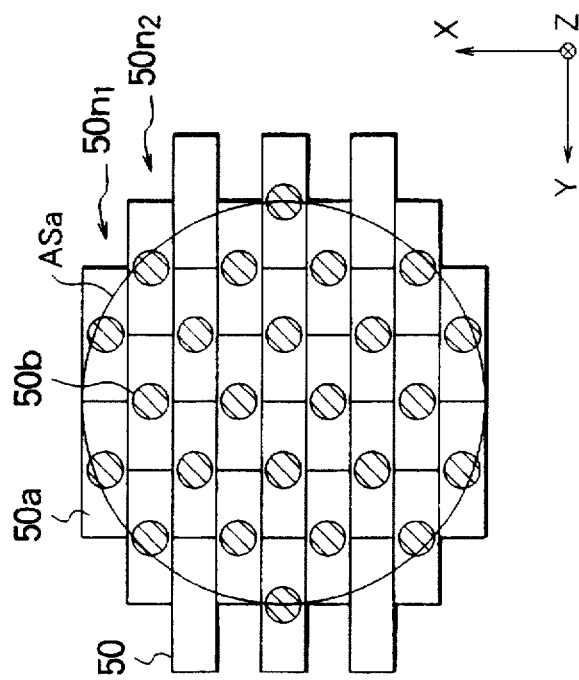
FIG. 5B is a plan view showing a second fly-eye lens shown in FIG. 4, which is viewed from the illuminated surface side.
Figure 5A:
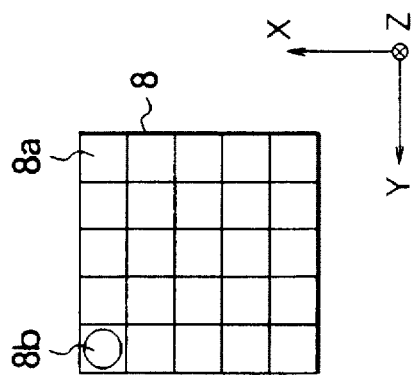
FIG. 5A is a plan view showing a first fly-eye lens shown in FIG. 4, which is viewed from an illuminated surface side.

As shown in FIG. 5A as the plan view showing the first fly-eye lens viewed from an illuminated surface side, the first fly-eye lens 8 is constituted by arranging a plurality of lens elements $8a$ each having an almost square lens section in a matrix. The lens elements $8a$ form light source images $8b$ on the exit surface side of the lens elements. FIG. 5A shows only one of the light source images $8b$ formed by the lens elements $8a$. In fact, however, all the lens elements form the light source images.

Referring back to FIG. 4, a relay lens system 7 and a second fly-eye lens 50 are arranged on the exit surface side of the first fly-eye lens 8. The relay lens system 7 has a function of making the incident surface of the first fly-eye lens 8 conjugate to that of the second fly-eye lens 50 and also making the exit surface of the first fly-eye lens 8 conjugate to that of the second fly-eye lens 50.

As shown in FIG. 5B as the plan view showing the second fly-eye lens 50 viewed from the illuminated surface side, the fly-eye lens 50 has at least a first stage $50n_1$ in which a plurality of lens elements 50a each having a rectangular lens section with long and short sides are arranged while their short sides are set adjacent to each other, and a second stage $50n_2$ in which the plurality of lens elements 50a are arranged while their short sides are set adjacent to each other. The short sides in the first stage $50n_1$ are arranged at positions different from those in the second stage $50n_2$ along the longitudinal direction (Y direction) of the lens elements 50a.

Light source images 50b formed by the lens elements 50a constituting the second fly-eye lens 50 correspond to the images of the plurality of light source images 8b formed by the first fly-eye lens 8. Therefore, a more uniform surface illuminant can be formed in an opening portion ASa of an aperture stop AS, so that the illuminance variation can be further minimized.

Referring back to FIG. 4, the light beams from the tertiary sources formed by the second fly-eye lens 50 are condensed by a condenser lens 6 to illuminate a reticle R in a superposed manner. At this time, a rectangular (slit-like) illumination field is formed on the reticle R.

The light beam from the illumination field on the reticle R passes through a double-telecentric projection optical system (projection lens) PL to form a pattern image of the reticle R on a wafer W.

In this embodiment, to eliminate the non-uniformity of a surface illuminant, which poses a problem when a so-called double fly-eye illumination optical system using the two fly-eye lenses 8 and 50 is used to efficiently illuminate a rectangular (slit-like) illumination field, the present invention is applied to the second fly-eye lens 50 which inevitably has an incident surface in a shape similar to the illuminated surface. With this arrangement, a uniform surface illuminant can be formed, though the illuminated surface is rectangular (slit-like). In addition, the line width on the wafer W can be made uniform.

In the above-described first and second embodiments, the present invention is applied to a so-called step and scan type projection exposure apparatus which performs an exposure operation while relatively moving a reticle and a wafer. However, the present invention is not limited to the step and scan type projection exposure apparatus. In a step and repeat type exposure apparatus (stepper) which exposes a circuit pattern of a reticle on a wafer in one shot, the outer shape of the circuit pattern area formed on the reticle is not limited to a square and sometimes a rectangle with long and short sides. In such a case, the present invention can be applied to efficiently illuminate the rectangular illumination field.

Third Embodiment

The third embodiment in which the present invention is applied to a stepper having an illumination optical system for illuminating a reticle R with a rectangular illumination field will be described below with reference to FIG. 6. The same reference numerals as in FIG. 1 denote the same members in FIG. 6, and an X-Y-Z coordinate system is employed in FIG. 6.

Figure 6:
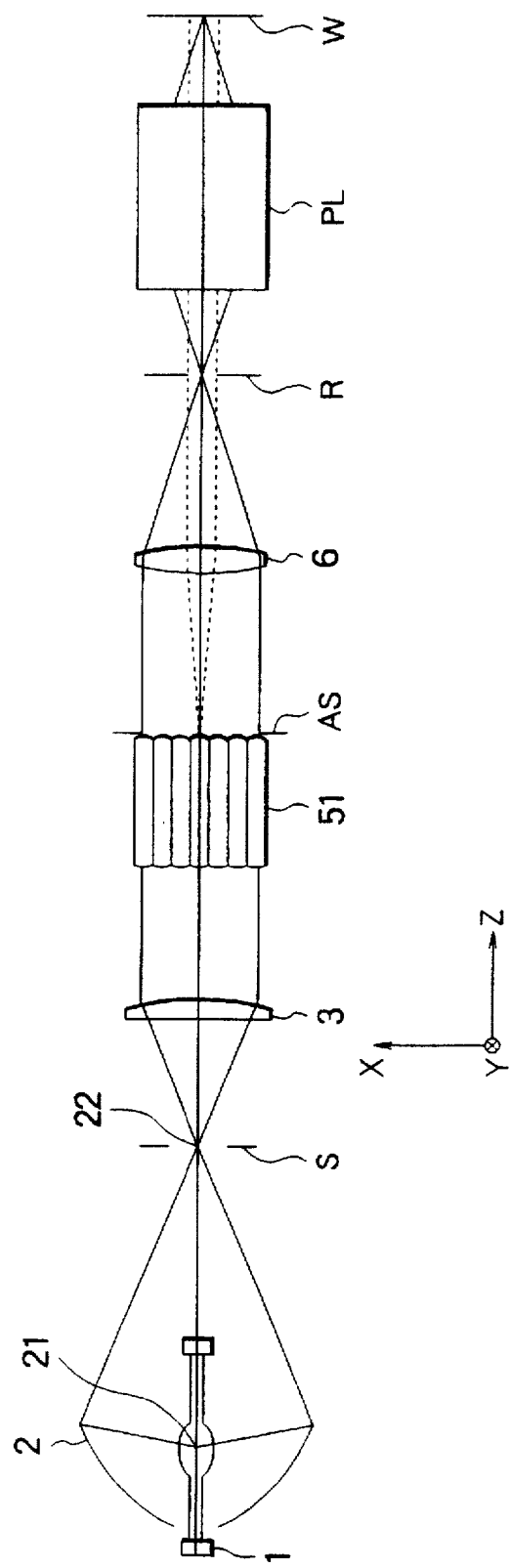
FIG. 6 is a view schematically showing the entire arrangement of an illumination optical apparatus according to the third embodiment of the present invention, which is applied to a projection exposure apparatus.

Referring to FIG. 6, a light beam from a mercury lamp 1 arranged at a first focal point 21 of an elliptical mirror 2 is condensed at a second focal point 22 by the elliptical mirror 2 to form a light source image. The light beam from the second focal point 22 is collimated into a parallel beam by a collimator lens 3 and thereafter incident on a fly-eye lens 51 through a bandpass filter (not shown).

Figure 7:
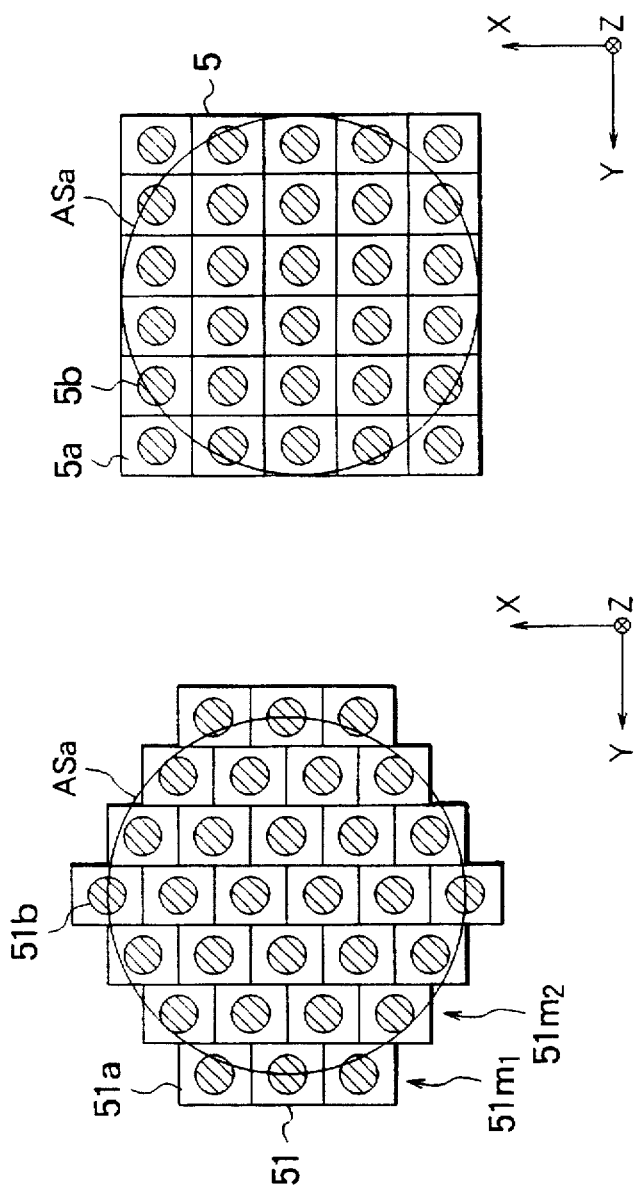
FIG. 7A is a plan view showing a fly-eye lens shown in FIG. 6, which is viewed from an illuminated surface side.
FIG. 7B is a plan view showing a conventional fly-eye lens, which is viewed from the illuminated surface side.

As shown in FIG. 7A as the plan view showing the fly-eye lens 51 viewed from an illuminated surface side, the fly-eye lens 51 has at least a first stage $51m_1$ in which a plurality of lens elements 51a each having a rectangular lens section with long and short sides are arranged while their short sides are set adjacent to each other, and a second stage $51m_2$ in which the plurality of lens elements 51a are arranged while their short sides are set adjacent to each other. The short sides in the first stage $51m_1$ are arranged at positions different from those in the second stage $51m_2$ along the longitudinal direction (X direction) of the lens elements 51a.

With this arrangement, as compared to a conventional fly-eye lens 5 shown in FIG. 7B, the light intensity distributions along the longitudinal direction (X direction) and along the widthwise direction (Y direction) of the lens elements 51a become uniform, so the surface illuminant formed by the fly-eye lens 51 can be made uniform.

Referring back to FIG. 6, an aperture stop AS having an opening portion ASa in a predetermined shape is arranged at the position of the surface illuminant formed by the fly-eye lens 51. Light beams from the plurality of light source images formed at the position of the aperture stop AS are condensed by a condenser lens 6 to illuminate the reticle R in a superposed manner. The illumination field formed on the reticle R has a shape similar to that of the lens surface on the incident surface side of the fly-eye lens 51.

The light beam from the illuminated reticle R forms the pattern image of the reticle R on a wafer W through a double-telecentric projection optical system (projection lens). In this embodiment, the light intensity distribution of the surface illuminant formed by the fly-eye lens 51 becomes uniform along both the X and Y directions. Therefore, the line width on the wafer W can be made uniform.

Fourth Embodiment

Figure 8:
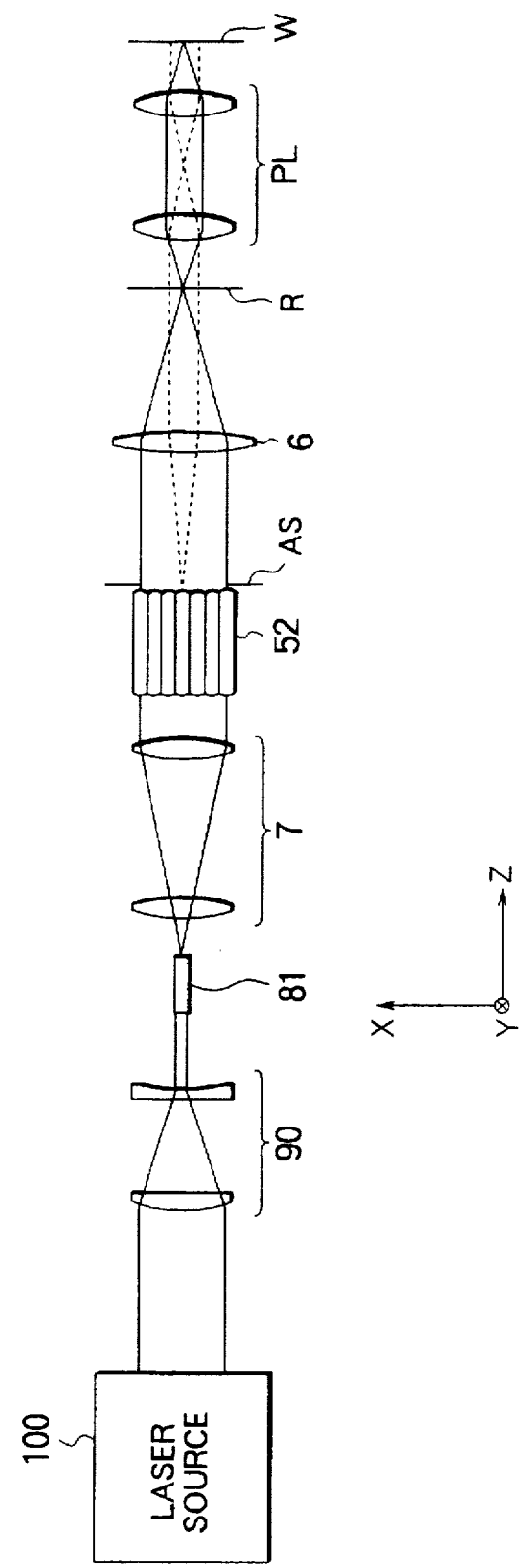
FIG. 8 is a view schematically showing the entire arrangement of an illumination optical apparatus according to the fourth embodiment of the present invention, which is applied to a projection exposure apparatus.

The fourth embodiment of the present invention will be described below with reference to FIG. 8. FIG. 8 is a view showing a step and scan type exposure apparatus to which a laser source is applied as a light source. The same reference numerals as in FIG. 1 denote the same members in FIG. 8, and an X-Y-Z coordinate system is employed in FIG. 8.

Referring to FIG. 8, a laser source 100 is constituted by a KrF excimer laser for emitting a light beam having a wavelength of 248 nm or an ArF excimer laser for emitting a light beam having a wavelength of 193 nm. The sectional shape of a parallel beam from the laser source 100 is converted by a cylinder expander 90 consisting of, e.g., two sets of cylindrical lenses into a shape similar to the sectional shape of a first fly-eye lens 81 located on the exit side of the cylinder expander 90.

Figure 9B:
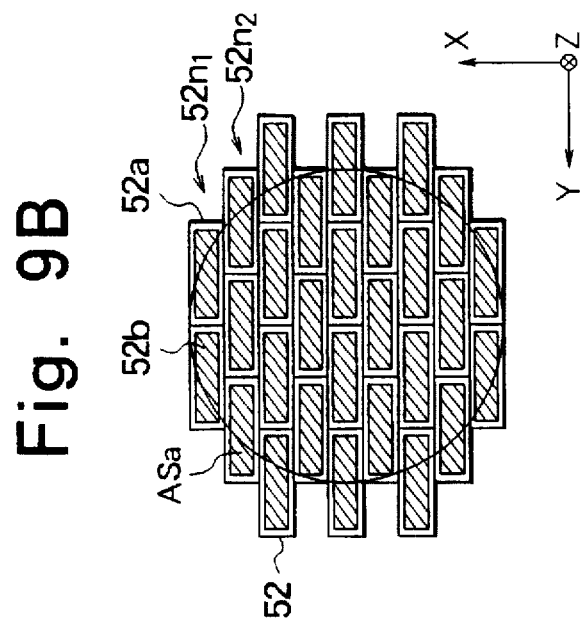
FIG. 9B is a plan view showing a second fly-eye lens shown in FIG. 8, which is viewed from the illuminated surface side.
Figure 9A:
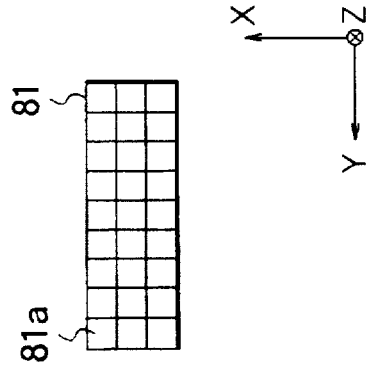
FIG. 9A is a plan view showing a first fly-eye lens shown in FIG. 8, which is viewed from an illuminated surface side.

As shown in FIG. 9A as the plan view showing the first fly-eye lens 81 viewed from an illuminated surface side, the first fly-eye lens 81 is constituted by arranging lens elements 81a each having an almost square lens section in a shape almost similar to the slit-like illumination field on a reticle R.

Referring back to FIG. 8, a relay lens system 7 and a second fly-eye lens 52 are arranged on the exit surface side (+Z direction side) of the first fly-eye lens 81. The relay lens system 7 has a function of making the incident surface of the first fly-eye lens 81 conjugate to that of the second fly-eye lens 52 and also making the exit surface of the first fly-eye lens 81 conjugate to that of the second fly-eye lens 52.

As shown in FIG. 9B as the plan view showing the second fly-eye lens 52 viewed from the illuminated surface side, the second fly-eye lens 52 has at least a first stage $52n_1$ in which a plurality of lens elements 52a each having a rectangular lens section with long and short sides are arranged while their short sides are set adjacent to each other, and a second stage $52n_2$ in which the plurality of lens elements 52a are arranged while their short sides are set adjacent to each other. The short sides in the first stage $52n_1$ are arranged at positions different from those in the second stage $52n_2$ along the longitudinal direction (Y direction) of the lens elements 52a.

The outer shape of a plurality of light source images formed by the first fly-eye lens 81 is similar to the illumination field on the reticle R, i.e., the incident surface of each of the plurality of lens elements 52a constituting the second fly-eye lens 52. For this reason, a plurality of light source images are formed on the respective exit surfaces of the plurality of lens elements 52a of the second fly-eye lens 52, and each light source image has almost the same size and shape as those of the exit surface. When the outer shape of the plurality of light source images formed by the first fly-eye lens 81 is made similar to the incident surface of each of the plurality of lens elements 52a of the second fly-eye lens 52, the uniformity of the plurality of light source images formed by the second fly-eye lens 52 increases as a whole.

If the second fly-eye lens has a simple matrix arrangement as in the prior art, the short sides of the lens elements, i.e., areas where no light source image is, formed are aligned in a line along the direction of columns of the second fly-eye lens. Therefore, the uniformity of the plurality of light source images formed by the second fly-eye lens 52 degrades.

In this embodiment, however, the short sides of the lens elements 52a constituting the second fly-eye lens 52, i.e., the areas where no light source image is formed, are arranged at random on the entire exit surface of the second fly-eye lens 52. Therefore, the uniformity of the surface illuminant formed in an opening portion ASa of an aperture stop AS arranged on the exit side of the second fly-eye lens 52 further increases. The number of light source images formed on the exit surface side of the second fly-eye lens 52 corresponds to the product of the number of the lens elements 81a constituting the first fly-eye lens 81 and the number of the lens elements 52a constituting the second fly-eye lens 52.

Referring back to FIG. 8, the light beams from the lens elements 52a of the second fly-eye lens 52 are condensed by a condenser lens 6 to illuminate the illumination field on the reticle R in a superposed manner. The light beam from the illuminated reticle R passes through a double-telecentric projection optical system PL to reach a wafer W, thereby forming the pattern image of the reticle R on the wafer W.

As described above, in this embodiment, the surface illuminant formed by the second fly-eye lens 52 can be made uniform while the rectangular illumination field is efficiently illuminated. Therefore, the uniformity of line width on the wafer W can be sufficiently increased.

Fifth Embodiment

The present invention is not limited to an illumination optical apparatus for forming a rectangular (slit-like) illumination field and can also be applied to an illumination optical apparatus for forming an arcuated illumination field. The fifth embodiment in which the present invention is applied to an illumination optical apparatus for forming an arcuated illumination field will be described with reference to FIGS. 10A and 10B. FIG. 10A is a Y-Z plan view of an illumination optical apparatus for illuminating a reticle with an arcuated illumination field. FIG. 10B is an X-Z plan view of the illumination optical apparatus. The same reference numerals as in FIG. 8 denote the same members in FIGS. 10A and 10B, and an X-Y-Z coordinate system is employed in FIGS. 10A and 10B.

The arrangement from a laser source 100 to a second fly-eye lens 52 in FIGS. 10A and 10B is the same as in the fourth embodiment, and a detailed description thereof will be omitted.

Referring to FIGS. 10A and 10B, a uniform surface illuminant is formed at the position of an aperture stop AS on the exit surface side of the second fly-eye lens 52, as in the fourth embodiment. Light beams from this surface illuminant, i.e., a plurality of light source, images are condensed by a relay lens 10, superposed on a stop FS having a rectangular opening on the X-Y plane, and guided to a special reflecting mirror 12 through a relay lens 11.

The special reflecting mirror 12 is constituted by part of a body of rotation having a parabolic/toric shape, which is obtained by rotating a parabola PA about a reference axis $AX_1$ orthogonal to an axis of symmetry $AX_0$ of the parabola PA. The relay lens 10 is an optical system having a projection relationship of $f \cdot \sin\Theta$. The relay lens 11 is an optical system having a projection relationship of $f\Theta$. Therefore, on a reticle R, Köhler illumination of an arcuated illumination field is performed. The numerical aperture of a light beam reaching a position in this illumination field is constant at any position.

Although not illustrated in FIGS. 10A and 10B, a projection optical system (e.g., an Oftener optical system) having an arcuated field is arranged on the $-X$ direction side (on the lower side of FIGS. 10A and 10B) of the reticle R, so that the pattern image of the reticle R can be projected on a wafer (not shown).

In the fifth embodiment shown in FIGS. 10A and 10B as well, the surface illuminant formed by the second fly-eye lens 52 can be made uniform while the arcuated illumination field is efficiently formed. Therefore, the uniformity of line width on the wafer can be sufficiently increased.

In the fourth and fifth embodiments, a laser source which can be regarded as a spot light source is used as a light source. As is apparent from the above description, the present invention can also be effectively applied to such a laser source.

In each of the above embodiments, the plurality of light source images in the first stage, which are formed by the fly-eye lens, shift from those in the second stage by a ½ pitch along the longitudinal direction. The arrangement of the plurality of light source images is not limited to such ½-pitch shift, and a random arrangement can be employed.

Sixth Embodiment

In each of the above embodiments, the first stage and the second stage, which constitutes the fly-eye lens as an optical integrator, are shifted relative to each other by a ½ pitch along the longitudinal direction.

The range of an optimum arrangement of the lens elements 50a as an optical integrator according to the present invention is explained hereinafter with reference to FIGS. 11A to 11C.

Figure 11A:
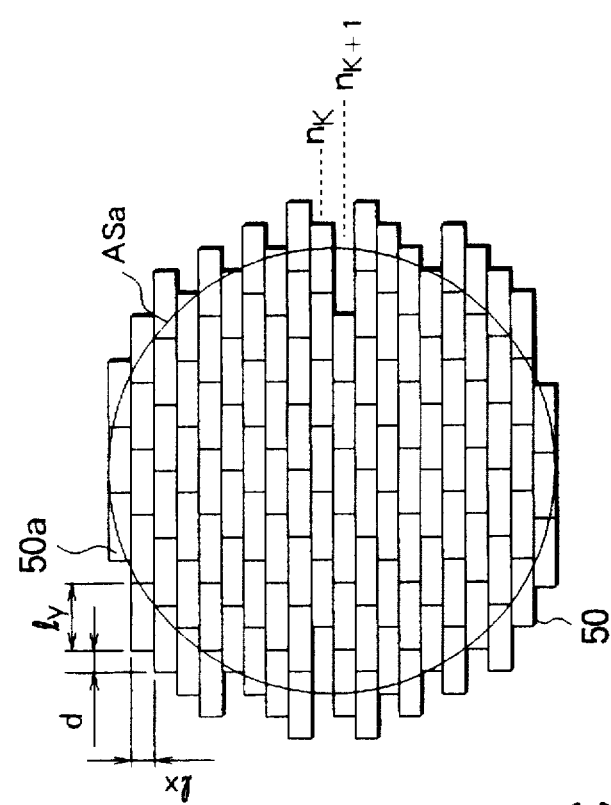
FIG. 11A is a X-Y plan view showing an optical integrator according to the sixth embodiment of the present invention, which is viewed from the illuminated surface side.
Figure 11B:
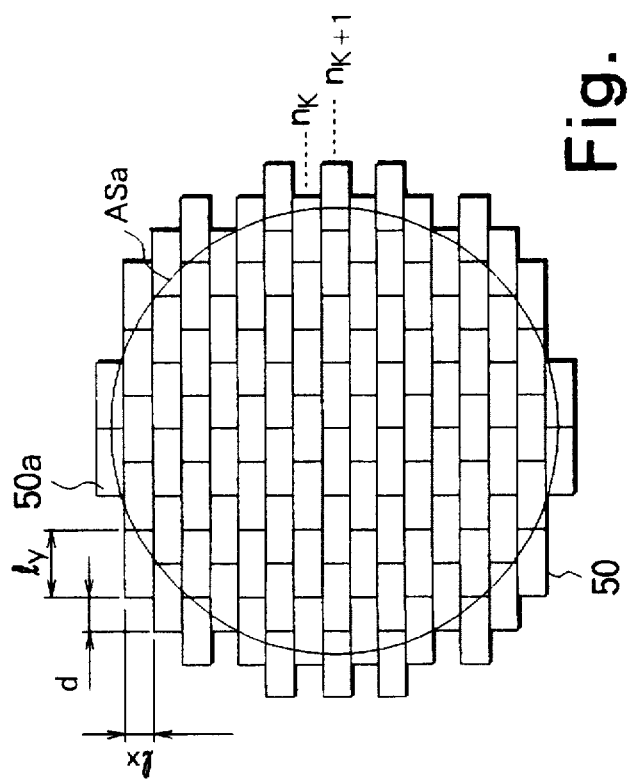
FIG. 11B is a X-Y plan view showing an optical integrator according to the sixth embodiment of the present invention, which is viewed from the illuminated surface side.

FIGS. 11A and 11B are X-Y plan view showing respectively an optical integrator according to the sixth embodiment of the present invention. In FIG. 11A, the first stage and the second stage, which constitutes the fly-eye lens, are shifted relative to each other by a ½ pitch along the longitudinal direction, and in FIG. 11B, the first stage and the second stage are shifted relative to each other by a ⅓ pitch along the longitudinal direction. FIG. 11C shows the relationships of a positional deviation d between short side lx of the first stage and short side lx of the second stage along long side ly direction.

Figure 11C:
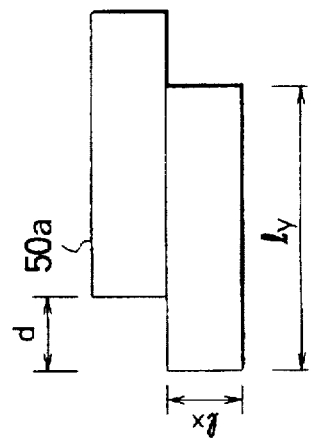
FIG. 11C is an enlarged view showing lens elements according to the sixth embodiment of the present invention.

As shown in FIGS. 11A to 11C, the fly-eye lens as an optical integrator according to the sixth embodiment of the present invention, has the first and second stage (e.g., a row $n_k$ and a row $n_{k+1}$, wherein k denotes a natural number indicating the number of the stage), in which the plurality of lens elements 50a each having a rectangular lens section with long and short sides are arranged while their short sides are set adjacent to each other.

It is noted that it is desirable to satisfy the following conditions;

$$ly/N \leq d \leq ly \cdot (N-1)/N \quad (1)$$

$$N^{0.5} < ly/lx < 25 \quad (2)$$

wherein d denotes the deviation between the position of the short side in the first stage (row $n_k$) and the position of the short side in the second stage (row $n_{k+1}$) along the long side direction (Y direction), is the lx short side length of the lens section of the lens elements 50a which constitute an optical integrator and (fly-eye lens), is the ly long side length of the lens section of the lens elements 50a. Also, d equals to the multiplied value of ly/N and N is a natural number equal to 2 or more (i.e., at least 2).

The above condition (1) exhibits the optimum deviation d between the position of the short side in the first stage (row $n_k$) and the position of the short side in the second stage (row $n_{k+1}$) along the long side direction (Y direction). Also, the above condition (2) exhibits the optimum range of the ratio ly/lx. These conditions are related intimately, and the deviation d in the condition (1) is determined based on the condition (2), which defines the ratio between the longitudinal direction and the lateral direction of the lens section of the lens elements 50a.

Here, the ratio ly/lx in the condition (2) is basically determined based on a specification of an illumination apparatus. However, if the ratio ly/lx exceeds the upper limit value defined in the condition (2), the short side length of the lens section of the lens elements 50a is extremely shortened, thereby preventing the manufacturing of the lens elements 50a. To the contrary, when applying the short side length of the lens elements 50a sufficient to easily manufacture the lens elements 50a, this results in an undesirably large-sized apparatus.

If the ratio ly/lx is less than the lower limit value defined in the condition (2), the shape of the lens section in the lens elements 50a becomes close to a square, thereby deteriorating the meaning of the arrangement where the neighboring lens elements 50a are deviated each other.

As mentioned above, by arranging a plurality of lens elements 50a as to satisfy the conditions (1) and (2) simultaneously, it is possible to approach the ratio of the distance between the light source images at rows and columns directions, which are formed by a plurality of the lens elements 50a, to one within the permissible range compared with the ratio between the long side length and the short side length of the lens elements, even constituting the lens section of the lens elements 50a to have a shape with long and short sides. For this reason, these conditions enable approaching the distance between the light source images at row and column directions to the same direction to the extent possible. Namely, the spatial coherence at X and Y directions can be equalized with each other to the extent possible.

As a result, the problem, that the resolved line width in the X direction differs from that in the Y direction, can be improved.

Referring back to FIGS. 11A to 11C, concrete arrangements of a plurality of the lens elements 50a which comprise the fly-eye lens as an optical integrator are explained hereinafter.

FIG. 11A shows an arrangement of a plurality of lens elements 50a, where the first stage and the second stage, which constitutes the fly-eye lens, are shifted relative to each other by a ½ pitch along the longitudinal direction, and given as d=3 mm, lx=2.5 mm and ly=6.0 mm. In this arrangement, N is 2 and the corresponding values to the above conditions are as follows;

6 mm/2 $\leq d \leq$ 6 mm (2−1)/2

$$2^{0.5} < ly/lx < 25$$

Therefore, these values satisfy the two conditions (1) and (2).

FIG. 11B shows an arrangement of a plurality of lens elements 50a, where the first stage and the second stage, which constitutes the fly-eye lens, are shifted relative to each other by a ⅓ pitch along the longitudinal direction, and given as d=2 mm, lx=2.0 mm and ly=6.0 mm. In this arrangement, N is 3 and the corresponding values to the above conditions are as follows;

6 mm/3 $\leq d \leq$ 6 mm·(3−1)/3

$$3^{0.5} < ly/lx < 25$$

Therefore, these values satisfy the two conditions (1) and (2).

In FIG. 11B, the arrangement of a plurality of the lens elements 50a is shown where the first stage and the second stage are shifted relative to each other by a ⅓ pitch along the longitudinal direction and given as d=2 mm. However, as understood from the conditions (1) and (2), the present invention can be applied to the arrangement where the first stage and the second stage are shifted relative to each other by a ⅔ pitch along the longitudinal direction and d=4 mm.

Further, the present invention can also be applied to the arrangement where the first stage and the second stage, which constitutes the fly-eye lens, are shifted relative to each other by a ⅓ pitch along the longitudinal direction, and also the third stage and the fourth stage, which constitutes the fly-eye lens, are shifted relative to each other by a ⅔ pitch along the longitudinal direction.

As described above, the regular arrangements of a plurality of lens elements 50a are shown, where the first stage and the second stage of a plurality of the light source images formed by the fly-eye lens are shifted relative to each other by a predetermined pitch along the longitudinal direction, simultaneously the third stage and the fourth stage of a plurality of the light source images formed by the fly-eye lens are shifted relative to each other by a predetermined pitch along the longitudinal direction. The arrangement of the lens elements 50a is not restricted above, and the present invention also includes a random arrangement.

In the above-mentioned embodiments, the concrete values are given as follows.

In the first embodiment, a plurality of lens elements 50a is shown in FIG. 2, where the first stage and second stage, which constitutes the fly-eye lens, are shifted relative to each other by a ½ pitch along the longitudinal direction, and d=7.5 mm, lx=5.0 mm and ly=15.0 mm.

In the second embodiment, a plurality of lens elements 50a is shown in FIG. 5B, where the first stage and second stage, which constitutes the fly-eye lens, are shifted relative to each other by a ½ pitch along the longitudinal direction, and d=4.5 mm, lx=3.0 mm and ly=9.0 mm.

In the fourth and fifth embodiments, a plurality of lens elements 52a is shown in FIG. 9B, where the first stage and second stage, which constitutes the fly-eye lens, are shifted relative to each other by a ½ pitch along the longitudinal direction, and d=6.0 mm, lx=4.0 mm and ly=12.0 mm.

As a result, the lens elements in the first, second, fourth and fifth embodiments can be satisfied by the conditions (1) and (2) simultaneously.

As has been described above, when the illumination optical apparatus of the present invention is used, the resolution difference between a pattern along the vertical direction and that in the horizontal direction caused by a rectangular illuminated area with long and short sides or an arcuated illuminated area can be prevented, so that resolution with a uniform line width can be achieved.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 130438/1995 filed on May 29, 1995 is hereby incorporated by reference.

What is claimed is:

1. An illumination optical apparatus comprising:

a light source;

an optical integrator for forming a plurality of light source images on the basis of a light beam from said light source, said optical integrator having an incident side and an exit side; and a condenser optical system for condensing light beams emerging from said optical integrator to illuminate a predetermined surface in a superposed manner, wherein said optical integrator has first and second stages in which a plurality of lens elements each having a rectangular lens section with long and short sides are arranged such that said short sides are set adjacent to each other, said first and second stages are arranged adjacent to each other, and a position where said short sides are adjacent to each other in said first stage is different from that in said second stage along a longitudinal direction, and wherein each of said plurality of lens elements on the incident side has a sectional shape that is substantially similar to a sectional shape of each of said plurality of lens elements on the exit side.

2. An apparatus according to claim 1, wherein said first and second stages comprise a plurality of sets of stacked first and second stages of said lens elements.

3. An apparatus according to claim 1, wherein each of said plurality of lens elements has a front lens surface and a back lens surface.

4. An apparatus according to claim 1, wherein the position where said short sides are adjacent to each other in said first stage is substantially at a middle point of said long side of said lens element in said second stage.

5. An apparatus according to claim 1, which satisfies the following conditions:

$$ly/N \leq d \leq ly \cdot (N-1)/N \quad (1)$$

$$N^{0.5} < ly/lx < 25 \quad (2)$$

wherein lx denotes short side length of the rectangular lens section of said lens elements, ly denotes long side length of the rectangular lens section of said lens elements, N denotes 2 or more natural number, d denotes the deviation between the position of the short side in the first stage and the position of the short side in the second stage along the long side direction, and d equals to the multiplied value of ly/N.

6. A projection exposure apparatus comprising:

an illumination optical system for illuminating a first object; and a projection optical system for forming an image of said first object on a second object, wherein said illumination optical system has a light source, an optical integrator for forming a plurality of light source images on the basis of a light beam from said light source, said optical integrator having an incident side and an exit side, and a condenser optical system for condensing light beams emerging from said optical integrator to illuminate a predetermined surface in a superposed manner, said optical integrator having first and second stages in which a plurality of lens elements each having a rectangular lens surface with long and short sides are arranged such that said short sides are set adjacent to each other, said first and second stages are arranged adjacent to each other, and a position where said short sides are adjacent to each other in said first stage is different from that in said second stage along a longitudinal direction, and wherein each of said plurality of lens elements on the incident side has a sectional shape that is substantially similar to a sectional shape of each of said plurality of lens elements on the exit side.

7. An apparatus according to claim 6, wherein said optical integrator has a first optical integrator for forming the plurality of light source images on the basis of the light beam from said light source and a second optical integrator for forming a plurality of light source images on the basis of the light beams from said first optical integrator, said second optical integrator having an incident side and an exit side, and said second optical integrator having first and second stages in which a plurality of lens elements each having a rectangular lens section with long and short sides are arranged such that said short sides are set to adjacent to each other, said first and second stages are arranged adjacent to each other, and a position where said short sides are adjacent to each other in said first stage is different from that in said second stage along a longitudinal direction, and wherein each of said plurality of lens elements on the incident side has a sectional shape that is substantially similar to a sectional shape of each of said plurality of lens elements on the exit side.

8. An apparatus according to claim 6, wherein said illumination optical system illuminates said first object with a rectangular illumination field.

9. An apparatus according to claim 6, wherein said illumination optical system illuminates said first object with an arcuated illumination field.

10. An apparatus according to claim 6, wherein said first and second stages comprise a plurality of sets of stacked first and second stages of said lens elements.

11. An apparatus according to claim 6, wherein each of said plurality of lens elements has a front lens surface and a back lens surface.

12. An apparatus according to claim 6, wherein the position where said short sides are adjacent to each other in said first stage is substantially at a middle point of said long side of said lens element in said second stage.

13. An apparatus according to claim 6, which satisfies the following conditions:

$$ly/N \leq d \leq ly \cdot (N-1)/N \quad (1)$$

$$N^{0.5} < ly/lx < 25 \quad (2)$$

wherein lx denotes short side length of the rectangular lens section of said lens elements, ly denotes long side length of the rectangular lens section of said lens elements, N denotes 2 or more natural number, d denotes the deviation between the position of the short side in the first stage and the position of the short side in the second stage along the long side direction, and d equals to the multiplied value of ly/N.

14. An apparatus according to claim 7, wherein the position where said short sides are adjacent to each other in said first stage is substantially at a middle point of said long side of said lens element in said second stage.

15. An apparatus according to claim 7, which satisfies the following conditions:

$$ly/N \leq d \leq ly \cdot (N-1)/N \quad (1)$$

$$N^{0.5} < ly/lx < 25 \quad (2)$$

wherein lx denotes short side length of the rectangular lens section of said lens elements, ly denotes long side length of the rectangular lens section of said lens elements, N denotes a natural number equal to at least 2, d denotes the deviation between the position of the short side in the first stage and the position of the short side in the second stage along the long side direction, and d equals to the multiplied value of ly/N.

16. A method of manufacturing a semiconductor element or a liquid crystal display element by using the projection exposure apparatus according to claim 6, comprising the steps of:

illuminating a reticle on which a predetermined circuit pattern is formed as said first object by said illumination optical system; and exposing the pattern image of said reticle on a photosensitive substrate as said second object through said projection optical system.

17. A method of manufacturing a semiconductor element or a liquid crystal display element by using the projection exposure apparatus according to claim 6, comprising the steps of:

illuminating a reticle on which a predetermined circuit pattern is formed as said first object by said illumination optical system; and exposing the pattern image of said reticle on a photosensitive substrate as said second object through said projection optical system while relatively moving said reticle as said first object and said photosensitive substrate as said second object.

18. A method manufacturing a semiconductor element or a liquid crystal display element by using the projection exposure apparatus according to claim 7, comprising the steps of:

illuminating a reticle on which a predetermined circuit pattern is formed as said first object by said illumination optical system; and exposing the pattern image of said reticle on a photosensitive substrate as said second object through said projection optical system.

19. A method of manufacturing a semiconductor element or a liquid crystal display element by using the projection exposure apparatus according to claim 7, comprising the steps of:

illuminating a reticle on which a predetermined circuit pattern is formed as said first object by said illumination optical system; and exposing the pattern image of said reticle on a photosensitive substrate as said second object through said projection optical system while relatively moving said reticle as said first object and said photosensitive substrate as said second object.

20. A method of manufacturing a semiconductor element or a liquid crystal display element by using the projection exposure apparatus according to claim 12, comprising the steps of:

illuminating a reticle on which a predetermined circuit pattern is formed as said first object by said illumination optical system; and exposing the pattern image of said reticle on a photosensitive substrate as said second object through said projection optical system.

21. A method of manufacturing a semiconductor element or a liquid crystal display element by using the projection exposure apparatus according to claim 12, comprising the steps of:

illuminating a reticle on which a predetermined circuit pattern is formed as said first object by said illumination optical system; and exposing the pattern image of said reticle on a photosensitive substrate as said second object through said projection optical system while relatively moving said reticle as said first object and said photosensitive substrate as said second object.

22. A method of manufacturing a semiconductor element or a liquid crystal display element by using the projection exposure apparatus according to claim 13, comprising the steps of:

illuminating a reticle on which a predetermined circuit pattern is formed as said first object by said illumination optical system; and exposing the pattern image of said reticle on a photosensitive substrate as said second object through said projection optical system.

23. A method of manufacturing a semiconductor element or a liquid crystal display element by using the projection exposure apparatus according to claim 13, comprising the steps of:

illuminating a reticle on which a predetermined circuit pattern is formed as said first object by said illumination optical system; and exposing the pattern image of said reticle on a photosensitive substrate as said second object through said projection optical system while relatively moving said reticle as said first object and said photosensitive substrate as said second object.

24. A method of manufacturing a semiconductor element or a liquid crystal display element by using the projection exposure apparatus according to claim 14, comprising the steps of:

illuminating a reticle on which a predetermined circuit pattern is formed as said first object by said illumination optical system; and exposing the pattern image of said reticle on a photosensitive substrate as said second object through said projection optical system.

25. A method of manufacturing a semiconductor element or a liquid crystal display element by using the projection exposure apparatus according to claim 14, comprising the steps of:

illuminating a reticle on which a predetermined circuit pattern is formed as said first object by said illumination optical system; and exposing the pattern image of said reticle on a photosensitive substrate as said second object through said projection optical system while relatively moving said reticle as said first object and said photosensitive substrate as said second object.

26. A method of manufacturing a semiconductor element or a liquid crystal display element by using the projection exposure apparatus according to claim 15, comprising the steps of:

illuminating a reticle on which a predetermined circuit pattern is formed as said first object by said illumination optical system; and exposing the pattern image of said reticle on a photosensitive substrate as said second object through said projection optical system.

27. A method of manufacturing a semiconductor element or a liquid crystal display element by using the projection exposure apparatus according to claim 15, comprising the steps of:

illuminating a reticle on which a predetermined circuit pattern is formed as said first object by said illumination optical system; and exposing the pattern image of said reticle on a photosensitive substrate as said second object through said projection optical system while relatively moving said reticle as said first object and said photosensitive substrate as said second object.

* * * * *